United States Patent [19]
Denning et al.

[11] 3,988,759
[45] Oct. 26, 1976

[54] THERMALLY BALANCED PN JUNCTION

[75] Inventors: Richard Denning, Springfield;
Willem Gerard Einthoven, Belle Mead, both of N.J.

[73] Assignee: RCA Corporation, New York, N.Y.

[22] Filed: Aug. 26, 1974

[21] Appl. No.: 500,448

[52] U.S. Cl. ............................ 357/36; 357/55; 357/88
[51] Int. Cl.² .................. H01L 29/72; H01L 29/06
[58] Field of Search ........................ 357/36, 55, 88

[56] References Cited
UNITED STATES PATENTS

| | | | |
|---|---|---|---|
| 3,500,143 | 3/1970 | Lamming | 357/36 |
| 3,667,008 | 5/1972 | Katnack | 357/36 |
| 3,740,621 | 6/1973 | Carley | 357/36 |

*Primary Examiner*—Edward J. Wojciechowicz
*Attorney, Agent, or Firm*—H. Christoffersen; R. P. Williams; R. A. Hays

[57] ABSTRACT

Regions of high resistivity, with respect to the surrounding material, are designed into a semiconductor device at points where hot-spots have been observed. A device made in this manner has very good second breakdown characteristics. One application is in large area junction transistors having an interdigitated base-emitter configuration.

5 Claims, 2 Drawing Figures

THERMALLY BALANCED PN JUNCTION

This invention relates generally to localized ballasting of semiconductor devices such as transistors to reduce localized heating.

In large area junction transistors of interdigitated configuration, for example, the current density can vary significantly from point to point along the base-emitter PN junction. One reason this occurs is that the distance the current must travel, from an electrode somewhere on one side of the PN junction to an electrode somewhere on the other side of the PN junction, varies along the junction. Since current will follow the path of least resistance, it becomes obvious that there will be a current density distribution along the PN junction. The paths of higher current density will be higher in temperature due to the well known fact that power dissipation is equal to the collector voltage multiplied by the collector current. As the temperature rises, the localized base-emitter voltage decreases, and the current density increases. It is quite clear that this circle of events may easily lead to failure of the device, resulting from thermal breakdown of the PN junction.

The prior art has attempted to solve this problem by selectively moving either the base or emitter electrodes away from the PN junction in order to increase the local resistance at high current density points. By moving the metal away from the junction, the current is forced to travel a longer distance through the semiconductor material of the base or emitter, thereby introducing a distributed ballasting resistance into the device.

This solution is reasonable, but it does have significant limitations. The primary limitation is that the base and emitter metals can only be separated from the junction by a finite distance. The problem remains if the distance is not capable of introducing sufficient resistance. In an interdigitated configuration, the available distance is limited to obtain the maximum emitter periperhy.

Figure 1:
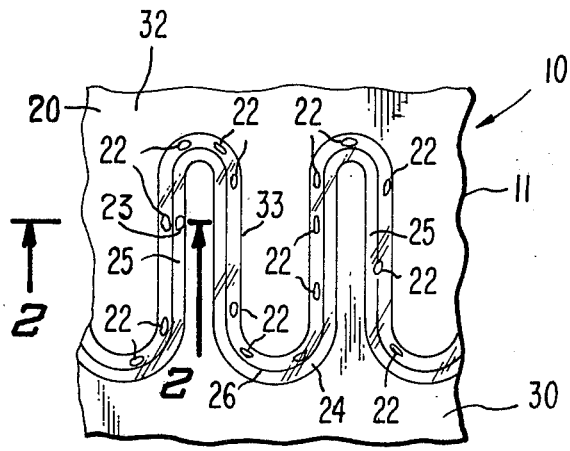
FIG. 1 is a partial plan view of the present novel device, not drawn to scale.
Figure 2:
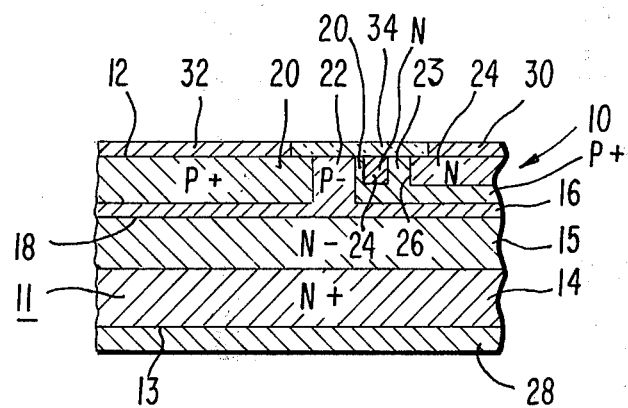
FIG. 2 is an enlarged partial cross-sectional view of the present novel device taken on the line 2—2 of FIG. 1.

The present device, indicated generally at 10 in the drawings, comprises a semiconductor wafer 11, having two major surfaces 12 and 13, and having therein lower and upper segments 14 and 15, respectively, of one type conductivity, N type in this example. The lower segment 14 has a much higher carrier concentration than the upper segment 15. A layer 16 of semiconductor, for example, an epitaxial layer, having a second type conductivity, P type in this example, forms a first PN junction 18 with the upper segment 15 of the semiconductor wafer 11. The carrier concentration in the layer 16, as it is initially formed, is from about $10^{13}$ atoms/cm$^3$ to about $10^{15}$ atoms/cm$^3$, and the layer 16 therefore has a sheet resistance of between about 20,000 $\Omega/\square$ and about 200 $\Omega/\square$.

The layer 16 is selectively doped with charge carriers to form a first portion 20 in which the carrier concentration has a value between about $10^{15}$ atoms/cm$^3$ and about $10^{20}$ atoms/cm$^3$ and, correspondingly, the sheet resistance is between about 200 $\Omega/\square$ to about 5 $\Omega/\square$.

At preselected positions, a plurality of regions 22 of the epitaxial layer 16 are not doped and therefore remain at the lower carrier concentration level. The plurality of regions 22 may be of any shape desired.

A second portion 24, having the one type conductivity, is formed within the first portion 20 and forms a second PN junction 26 therewith. The plurality of regions 22 may be partially contained in the second portion 24. For clarity the regions contained in the second portion 24 are designated at 23 in the drawings. In the embodiment shown the second portion 24 has fingers 25 in the well known interdigitated arrangement, with intermediate zones of the first portion 20. A protective layer 34 of insulating material is disposed on the surface 12 of the wafer 11.

A first electrode 28 is disposed on the back surface 13 of the semiconductor wafer 11, making electrical contact with the lower segment 14 thereof. A second electrode 30 makes electrical contact to the second portion 24 through suitable openings in the protective layer 34. A third electrode 32 makes electrical contact to a part of the first portion 20 through other suitable openings in the protective layer 34. The third electrode 32 is of such a configuration that it has an edge 23 which is spaced from the junction 26 so that a plurality of the regions 22 and 23 are in the electrical path between the third electrode 32 and the second electrode 30.

The upper and lower segments 15 and 14 comprise the collector region of the device, the junction 18 being the base-collector junction. The epitaxial layer 16, the first region 20, and the nondiffused regions 22 are the base region. The second portion 24 is the emitter region of the device. Consequently, the first electrode 28 is the collector electrode, the second electrode 30 is the emitter electrode, and third electrode 32 is the base electrode.

The present device may be fabricated by the following procedure, for example. The semiconductor wafer 11 with lower and upper segments, 14 and 15 respectively, can be obtained from many sources throughout the semiconductor industry, and the epitaxial layer 16 can be grown thereon as the first step of the process. The semiconductor wafer 11 may also be obtained with the epitaxial layer 16 already formed thereon. This, for example, may be the commmonly known $\pi$—$v$ substrate which has a p$^-$ epitaxial layer 16, an N$^-$ upper segment 15, and an N$^+$ lower segment 14. It wil be understood by those familiar with the art that the conductivity types may be properly reversed without changing the scope of this invention. Of course, one may begin with a homogeneous wafer of semiconductor material and obtain the upper and lower segments 15 and 14 by proper doping, and then grow the epitaxial layer by the usual known processes.

Once the epitaxial layer 16, in this example having P$^-$ conductivity, is formed, the wafer is oxidized to form a masking layer, not shown. The oxidation may be, for example, the thermal growth of silicon dioxide (Sio$_2$), grown preferably to a thickness between about 7000 A and about 20,000 A; for example, 10,000 A. By means of a photoresist and etching method, which is well known in the art, the perimeter of the surface of the first portion 20 is exposed through the oxide. At preselected positions, the remaining oxide covers, and protects from diffusion, the surfaces of the plurality of regions 22.

Next, conductivity modifiers are introduced into the epitaxial layer 16 to form the first portion 20. This may be accomplished, for example, by solid-to-solid diffusion in which a suitable doped oxide is deposited over the whole wafer. In this example, a boron doped oxide would be suitable, but a doped oxide containing any Group III element could be used. By means of known heat treatments, the boron is driven into the epitaxial layer through the previously exposed surface of the first portion 20. This heat treatment takes place at a temperature between about 900° C and about 1200° C. After the amount of boron desired is driven into the epitaxial layer 16, all oxides are removed from the wafer. The first portion 20 is completed by driving the boron further into the epitaxial layer 16 without increasing the amount of boron present. This is accomplished by a second heat treatment at a temperature between about 1100° C. and about 1300° C. Hence, the plurality of regions 22 remain undoped and, as shown in the drawings, are substantially laterally surrounded by the first portion 20. The plurality of regions 22, as shown in the drawings are the regions of the comparatively undopd epitaxial layer 16 extending through the first portion 20 to the surface 12.

The carrier concentration of the first portion 20 is now higher than the carrier concentration of the plurality of regions 22 located therein, the difference being on the order of between about $10^2$ atoms/cm$^3$ and about $10^5$ atoms/cm$^3$. The sheet resistance of the first portion 20 is now between about 5 $\Omega/\square$ to about 100 $\Omega/\square$, whereas the values of sheet resistance for the plurality of regions 22 located therein is from about 200 $\Omega/\square$ to about 20,000 $\Omega/\square$.

Following the fabrication of the first portion 20 and the plurality of regions 22 at preselected positions, the second portion 24 is formed. The process for forming the second portion 24 is similar to the process used to form the first portion 20, i.e., first oxidation, then photoresist and etching to determine the perimeter of the second portion 24, depositing a doped oxide, driving in the dopant, removing the remaining oxides, and finally driving in the dopant without increasing the amount of dopant present. The process is well known in the semiconductor art. It will be understood that a plurality of regions 23, similar to the plurality of regions 22, may be located within the second portion 24. In this case the second portion 24 would be formed around the plurality of region 23. In the preferred embodiment, the plurality of regions 23 located within the second portion 24 have been doped simultaneously with the first portion 20. Since the plurality of regions 23 are of second type conductivity and the second portion 24 is of one type conductivity, compensation would have to be made for the lateral diffusion of the second portion 24 into the plurality of regions 23. That is, for example, the mask for the plurality of regions 23 may be made oversized to allow lateral diffusion to occur but still retain the plurality of regions 23 of a second type conductivity. Since the second portion 24 is of N type conductivity, it forms the second PN junction 26 with the first portion 20 at their interface. The dopant may be, for example, phosphorous, or any suitable material from Group V. Hence, the plurality of regions 23, as shown in the drawings are substantially laterally surrounded by the second portion 24. As also shown in the drawings, the plurality of regions 23 are the regions of the first portion 20 extending through the second portion 24 to the surface 12.

The second portion 24 preferably has a carrier concentration on the order of between about $10^{17}$ atoms/cm$^3$ and about $10^{21}$ atoms/cm$^3$. It correspondingly has a sheet resistance between about 5 $\Omega/\square$ and about 0.2 $\Omega/\square$. After the second portion 24 is formed, the final layer of protectve oxide 34 is formed, preferably grown, over the complete surface 12. As shown in the drawings, if any of the plurality of regions 22 is located at the second PN junction 26 it would only be partially laterally surrounded by the first portion 20.

The first electrode 28 is fabricated by standard metallization process of the industry, for example, RF sputtering, chemical vapor deposition, or the like. The material which constitutes the first electrode 28 may be, for example, gold, aluminum, or the like.

The protective oxide 34 is next etched photolithographically in preparation for the formation of the second electrode 30 and the third electrode 32. The second electrode 30 is then formed to be overlying and in electrical contact with the second portion 24 exposed by the etching. The third electrode 32 is simultaneously formed to be overlying and in electrical contact with the first portion 20 exposed by the etching. The second electrode 30 and third electrode 32 may be fabricated by the same process as that which was used to fabricate the first electrode 28.

Those familiar with the art will realize that the three electrodes may be fabricated at the same time during the metallization process. If, however, the metallization process chosen is capable of only coating one side of the substrate, i.e., only one side of the substrate being exposed to the electrode-forming material, then the three electrodes may be formed in two steps. For example, the first electrode 28 may be formed in the first step and then the second and third electrodes, 30 and 32, respectively, may be formed in the second step.

The novel device is characterized by a reduction in localized heating and a relatively even current density distribution across the PN junction 26. In the example described, the particular device may be a large area junction transistor. The plurality of regions 22 introduced at preselected positions, at points of relatively high current density, for example, is a relatively high resistance whereby the current is forced to redistribute itself more evenly across the second PN junction 26.

One method, for example, of preselecting the positions for the regions 22 is to fabricate a test device, a test transistor, for example, which has a PN junction. While applying potentials to the test device, thereby causing a flow of current across the PN junction, take an infrared photograph of the test device. The photograph will indicate hot-spots along the PN junction of the test device. These hot-spots identify locations, within the material on at least one side of the junction, where the current density is higher than in other regions of the material on the one side of the PN junction. In a test transistor the PN junction is the base-emitter PN junction. The hot-spots may occur on either side or both sides of the PN junction. To form the utile device, for example, a utile transistor of the present invention the regions 22 are introduced at some of the locations corresponding to the locations of higher current density in the test device. These locations are the preselected positions aforementioned. That is, the locations of the hot-spots and the preselected positions are thus determined empirically. The members of the plurality of regions 22 may be of different sizes and shapes, and the particular size and shape of a given member of the plurality of regions 22 will depend on the amount of resistance desired at that particular preselected position. If a relatively large resistance is desired at a preselected position, the particular member at that preselected position should be relatively large.

In conventional practice, the base or emitter metal would be selectively moved away from the PN junction to introduce resistance at particular points. The problem remained if there was not sufficient room to remove the metal enough to introduce the desired resistance. Because the material of the plurality of regions 22 has a relatively much higher sheet resistance, from about 200 Ω/□ to about 20,000 Ω/□, compared to the conventional base material of from about 5 Ω/□ to about 100 Ω/□, the prior art problem of insufficient resistance in the distances allowed is eliminated. This is especially important for the interdigitated configuration. In the present device, the second and third electrodes 30 and 32, respectively, need not be moved away from the PN junction 26, because the relatively large range of resistances available allow an even distribution of current density without moving them.

What is claimed is:

1. A semiconductor device comprising;
   a semiconductor wafer having upper and lower segments of one type conductivity and a layer of a semiconductor material having a second type conductivity, and forming a first PN junction with said upper segment,
   a first portion of said layer having said second type conductivity and having a higher carrier concentration than the remainder of said layer, said first portion at least partially laterally surrounding a first plurality of regions located at empirically determined preselected positions which, but for said plurality of regions, would be positions of relatively high current density in said layer, said first plurality of regions being comparatively undoped regions of said layer extending through said first portion,
   a second portion of said layer having said one type conductivity and being within said first portion and forming a second PN junction, therewith,
   a first electrode formed on, and in electrical contact with, said lower segment of said wafer,
   a second electrode overlying and making electrical contact to said second portion, and
   a third electrode overlying and making electrical contact to a part of said first portion, positioned such that said first plurality of regions are in the electrical path from said third electrode to said second PN junction.

2. A semiconductor device as described in claim 1 wherein:
   said semiconductor device is a junction transistor and,
   said wafer constitutes the collector portion, said first portion constitutes the base portion, said second portion constitutes the emitter portion, said first electrode is the collector electrode, said second electrode is the emitter electrode and, said third electrode is the base electrode.

3. A semiconductor device as claimed in claim 1 wherein:
   said higher carrier concentration of said first portion is on the order of magnitude of about $10^2$ atoms/cm$^3$ to about $10^5$ atoms/cm$^3$ larger than the concentration in said layer.

4. A semiconductor device as claimed in claim 1 wherein:
   said regions have sheets resistance from about 200 Ω/□ to about 20,000 Ω/□.

5. A semiconductor device as claimed in claim 1 wherein said second portion further comprises:
   a second plurality of regions at least partially surrounded by said second portion located at empirically determined preselected positions of relatively high current density, said second plurality of regions being comprised of material of said first portion extending through said second portion.

* * * * *